(12) United States Patent
Osanai (10) Patent No.: US 9,923,557 B2
(45) Date of Patent: Mar. 20, 2018

(54) SWITCHING CIRCUIT AND POWER CONVERSION CIRCUIT

(71) Applicant: TOYOTA JIDOSHA KABUSHIKI KAISHA, Toyota-shi, Aichi-ken (JP)

(72) Inventor: Yosuke Osanai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/341,311

(22) Filed: Nov. 2, 2016

(65) Prior Publication Data

US 2017/0149330 A1   May 25, 2017

(30) Foreign Application Priority Data

Nov. 24, 2015 (JP) ................... 2015-229094

(51) Int. Cl.
| | |
|---|---|
| *H02M 1/08* | (2006.01) |
| *H02M 3/07* | (2006.01) |
| *H03K 17/0412* | (2006.01) |
| *H02M 1/088* | (2006.01) |
| *H02M 1/096* | (2006.01) |
| *H02M 1/084* | (2006.01) |
| *H03K 17/06* | (2006.01) |

(52) U.S. Cl.
CPC ........ *H03K 17/04123* (2013.01); *H02M 1/08* (2013.01); *H02M 1/084* (2013.01); *H02M 1/088* (2013.01); *H02M 1/096* (2013.01); *H02M 3/07* (2013.01); *H03K 2017/066* (2013.01); *H03K 2217/0036* (2013.01); *H03K 2217/0081* (2013.01)

(58) Field of Classification Search
CPC .......... H02M 1/08; H02M 1/84; H02M 1/088; H02M 1/096; H02M 3/07
See application file for complete search history.

(56) References Cited

U.S. PATENT DOCUMENTS

| 2004/0263219 A1 | 12/2004 | Ozaki |
| 2009/0033377 A1 | 2/2009 | Hashimoto et al. |
(Continued)

FOREIGN PATENT DOCUMENTS

| JP | 2005-020975 A | 1/2005 |
| JP | 2009-021823 A | 1/2009 |
(Continued)

*Primary Examiner* — Timothy J Dole
*Assistant Examiner* — Ishrat Jamali
(74) *Attorney, Agent, or Firm* — Oliff PLC (57) ABSTRACT

A first switching element and a gate of a voltage-driven switching element are connected by a gate turn-on wiring through a first resistor. The gate of the voltage-driven switching element and a second switching element are connected by a gate turn-off wiring through a second resistor. A charge pump unit has a first capacitor, and a second capacitor configured to output a negative voltage. A resistor unit is arranged in at least one of a first wiring configured to connect the gate turn-on wiring and the first capacitor and a second wiring configured to connect the gate turn-off wiring and the first capacitor, and is configured to charge the first capacitor through the first wiring when the first switching element is turned on and to discharge the first capacitor through the second wiring when the second switching element is turned on.

7 Claims, 10 Drawing Sheets

(56) References Cited

U.S. PATENT DOCUMENTS

2012/0306469 A1    12/2012  Shono
2014/0043009 A1*  2/2014  Sakai .................... H02M 3/156
                                                                     323/311

FOREIGN PATENT DOCUMENTS

| JP | 2012-249492 A | 12/2012 |
| JP | 2014-110724 A | 6/2014 |
| JP | 2014-166085 A | 9/2014 |

\* cited by examiner

SWITCHING CIRCUIT AND POWER CONVERSION CIRCUIT

INCORPORATION BY REFERENCE

The disclosure of Japanese Patent Application No. 2015-229094 filed on Nov. 24, 2015 including the specification, drawings and abstract is incorporated herein by reference in its entirety.

BACKGROUND

1. Field of the Disclosure

A technique disclosed in this specification relates to a switching circuit and a power conversion circuit. In detail, a technique disclosed in this specification relates to a switching circuit including a charge pump unit and a power conversion circuit.

2. Description of Related Art

A voltage-driven switching element, such as an IGBT or a MOSFET, is used for various purposes, and for example, is used for a power conversion circuit, such as a converter device which transforms a DC voltage or an inverter device which converts a DC voltage to an AC voltage. In order to drive the voltage-driven switching element, a switching element which operates based on a control signal is used. The switching circuit is configured to connect a gate of the voltage-driven switching element to a positive electrode of a DC power supply in a turn-on period and to connect the gate of the voltage-driven switching element to a negative electrode of the DC power supply in a turn-off period. With this, the voltage-driven switching element is turned on with an increase in gate voltage in the turn-on period and is turned off with a decrease in gate voltage in the turn-off period. In this kind of switching circuit, a charge pump unit configured to generate a negative voltage may be provided. For example, Japanese Patent Application Publication No. 2012-249492 (JP 2012-249492 A) discloses a switching circuit including a charge pump unit configured to generate a negative voltage based on a pulse signal.

SUMMARY

In the switching circuit including a charge pump unit, it is possible to generate a negative voltage in the charge pump unit using a pulse signal for turning on/off a voltage-driven switching element. However, if such a configuration is used, the switching speed of the voltage-driven switching element decreases, and a switching loss increases.

Figure 9:
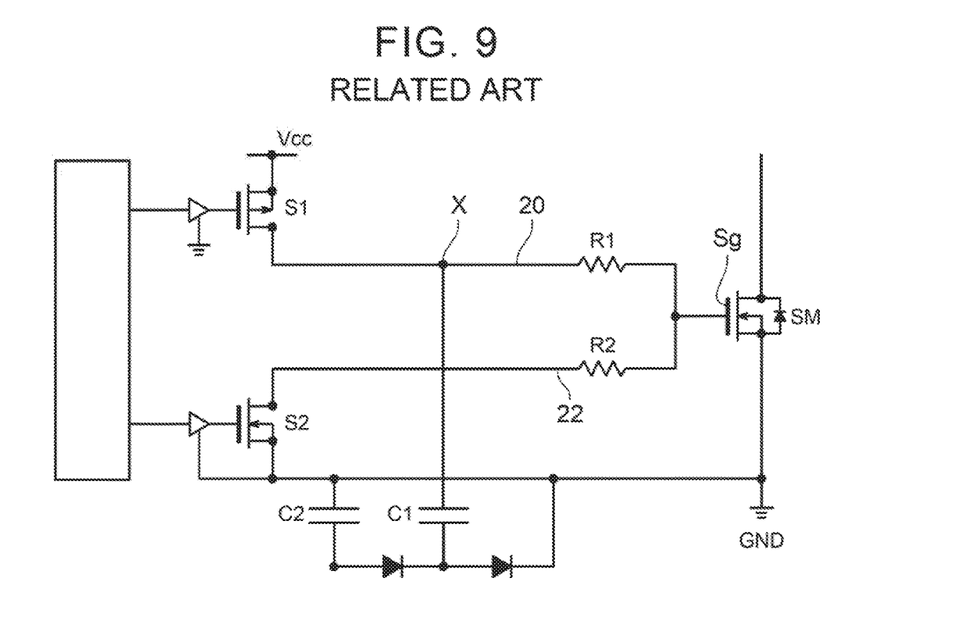
FIG. 9 is a diagram showing an example of a switching circuit including a charge pump unit.

For example, in a switching circuit shown in FIG. 9, a power supply potential Vcc and a gate Sg of a voltage-driven switching element SM are connected by a gate turn-on wiring 20. In the gate turn-on wiring 20, a first switching element S1 and a first resistor R1 are arranged. The gate Sg of the voltage-driven switching element SM and a ground potential GND are connected by a gate turn-off wiring 22. In the gate turn-off wiring 22, a second resistor R2 and a second switching element S2 are arranged. A charge pump unit has a first capacitor C1, and a second capacitor C2 configured to output a negative voltage. The first capacitor C1 is connected to the gate turn-on wiring 20 at a connection point X between the first switching element S1 and the first resistor R1. In this switching circuit, in a case of turning on the voltage-driven switching element SM, the first switching element S1 is turned on, and the second switching element S2 is turned off. With this, an electric charge is charged in the gate Sg of the voltage-driven switching element SM, and the voltage-driven switching element SM is turned on. In a case of turning off the voltage-driven switching element SM, the first switching element S1 is turned off, and the second switching element S2 is turned on. With this, an electric charge is discharged from the gate Sg of the voltage-driven switching element SM, and the voltage-driven switching element SM is turned off.

In a case of turning on the voltage-driven switching element SM, an electric charge is also charged in the first capacitor C1 of the charge pump unit. At this time, since the impedance of the first switching element S1 is low, a voltage of the connection point X increases to the power supply potential Vcc in a short period of time. For this reason, even if the first capacitor C1 is connected to the connection point X, a decrease in turn-on speed of the voltage-driven switching element SM is suppressed, and an increase in switching loss is also suppressed. However, in a case of turning off the voltage-driven switching element SM, an electric charge charged in the first capacitor C1 when the voltage-driven switching element SM is turned on is discharged through the first resistor R1 and the second resistor R2. For this reason, in the second resistor R2, not only an electric charge charged in the gate Sg of the voltage-driven switching element SM but also an electric charge charged in the first capacitor C1 flow. For this reason, the turn-off speed of the voltage-driven switching element SM decreases, and an increase in switching loss occurs.

Figure 10:
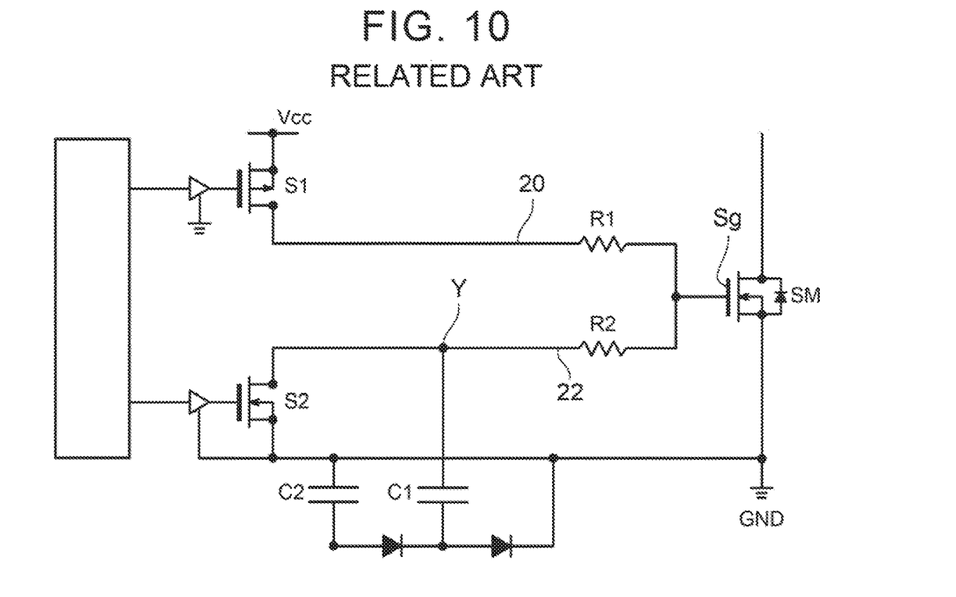
FIG. 10 is a diagram showing another example of a switching circuit including a charge pump unit.

For example, like a switching circuit shown in FIG. 10, a case where a first capacitor C1 is connected to a gate turn-off wiring 22 at a connection point Y between a second resistor R2 and a second switching element S2 is considered. In this switching circuit, in a case of turning off a voltage-driven switching element SM, since the impedance of the second switching element S2 is low, a voltage of the connection point Y decreases to a ground voltage GND in a short period of time. For this reason, even if the first capacitor C1 is connected to the connection point Y, a decrease in turn-off speed of the voltage-driven switching element SM is suppressed, and an increase in switching loss is also suppressed. However, in a case of turning on the voltage-driven switching element SM, the first capacitor C1 is charged through a first resistor R1 and the second resistor R2. For this reason, in the first resistor R1, not only an electric charge for charging the gate Sg but also an electric charge for charging the first capacitor C1 flow. For this reason, the turn-on speed of the voltage-driven switching element SM decreases, and an increase in switching loss occurs.

Figure 11:
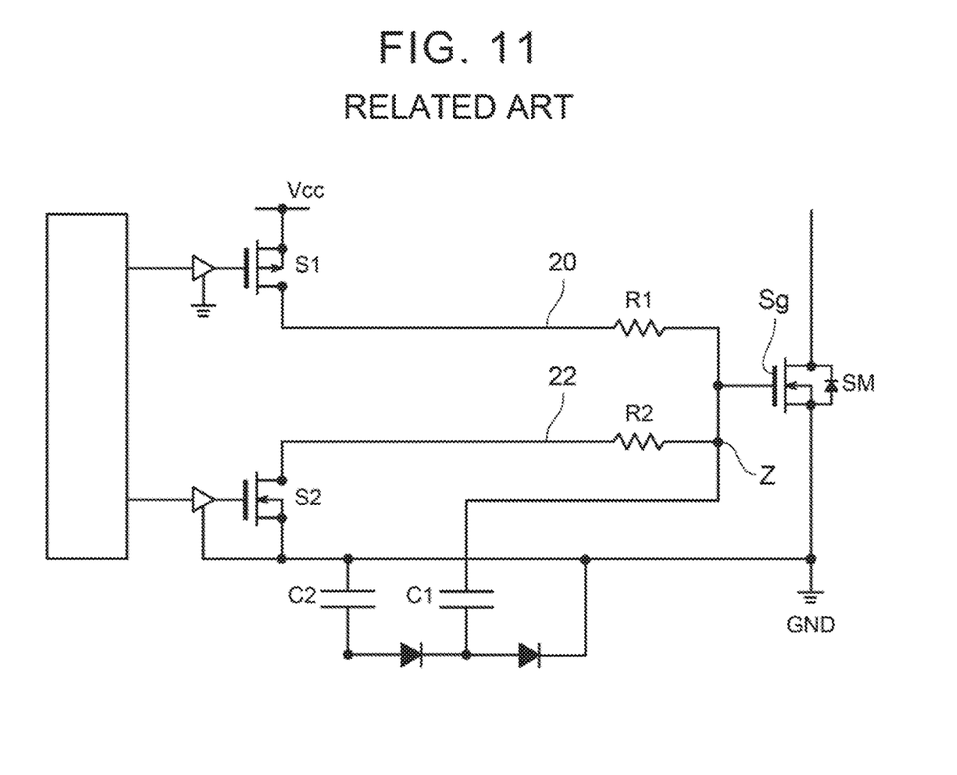
FIG. 11 is a diagram showing another example of a switching circuit including a charge pump unit.

For example, like a switching circuit shown in FIG. 11, a case where a first capacitor C1 is connected to a gate Sg of a voltage-driven switching element SM at a connection point Z is considered. In this configuration, the first capacitor C1 is connected in parallel to the gate Sg of the voltage-driven switching element SM. In this case, in a case of turning on the voltage-driven switching element SM, an electric charge charged in the first capacitor C1 flows in the first resistor R1. In a case of turning off the voltage-driven switching element SM, an electric charge charged in the first capacitor C1 flows in the second resistor R2. That is, in the first resistor R1 and the second resistor R2, not only an electric charge charged in and discharged from the gate Sg of the voltage-driven switching element SM but also an electric charge charged in and discharged from the first capacitor C1 flow. For this reason, the turn-on/turn-off speed of the switching element SM decreases, and an increase in switching loss occurs.

This specification discloses a switching circuit including a charge pump unit, having an advantage of suppressing a decrease in switching speed and suppressing an increase in switching loss.

The first aspect of the present disclosure is a switching circuit including: a first switching element; a first gate turn-on wiring connected to the first switching element; a first resistor connected to the first gate turn-on wiring; a second gate turn-on wiring connecting the first resistor and a gate of a voltage-driven switching element; a second switching element; a first gate turn-off wiring connected to the second switching element; a second resistor connected to the first gate turn-off wiring; a second gate turn-off wiring connecting the second resistor and the gate of the voltage-driven switching element; a charge pump unit including a first capacitor, and a second capacitor configured to output a negative voltage using an electric charge charged in the first capacitor; a first wiring connecting the first gate turn-on wiring and a first terminal of the first capacitor; a second wiring connecting the first gate turn-off wiring and the first terminal of the first capacitor; and a charge pump charging-discharging unit disposed in the first wiring or the second wiring, the charge pump charging-discharging unit configured to charge the first capacitor through the first wiring when the first switching element is turned on, and the charge pump charging-discharging unit configured to discharge the first capacitor through the second wiring when the second switching element is turned on.

According to the above-described aspect, in a case of turning on the voltage-driven switching element, the first capacitor is charged through the first wiring. Since an electric charge charged in the first capacitor does not flow in the first resistor, a decrease in turn-on speed of the voltage-driven switching element is suppressed, and an increase in switching loss can be suppressed. In a case of turning off the voltage-driven switching element, an electric charge charged in the first capacitor is discharged through the second wiring. Since an electric charge charged in the first capacitor does not flow in the second resistor, a decrease in turn-off speed of the voltage-driven switching element is suppressed, and an increase in switching loss can be suppressed. According to this switching circuit, it is possible to suppress a decrease in switching speed of the voltage-driven switching element and to suppress an increase in switching loss.

The second aspect of the present disclosure is a power conversion circuit comprising: a voltage-driven switching element; and the switching circuit according to the above-described aspect configured to drive the voltage-driven switching element.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
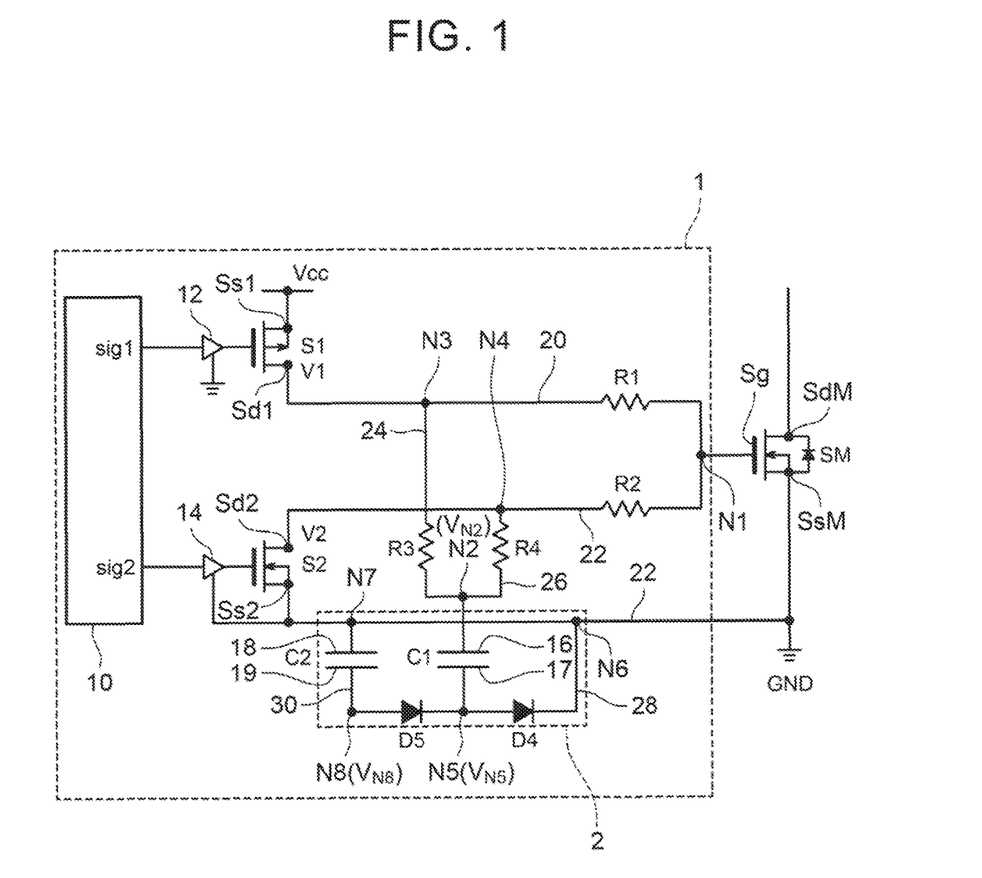
FIG. 1 is a diagram showing the configuration of a switching circuit of Example 1.

FIG. 1 is a circuit diagram of a switching circuit 1 which drives a voltage-driven switching element SM (hereinafter, simply referred to as a switching element SM). The switching circuit 1 of this example switches the on and off states of the switching element SM. The switching element SM is a power semiconductor element having an insulating gate, and specifically, is an n-channel type MOSFET. The switching element SM is configured such that a drain SdM and a source SsM are brought into an electric conduction state in a state where a gate turn-on voltage is applied to a gate Sg, and the drain SdM and the source SsM are brought into a non-electric conduction state in a state (gate turn-off state) where the gate turn-on voltage is not applied to the gate Sg. The switching element SM includes a reflux diode. The switching element SM is provided in a power conversion circuit, such as an inverter device which converts a DC voltage to an AC voltage.

The switching circuit 1 includes a gate drive unit (20, 22, S1, S2, R1, R2), a charge pump unit 2, and a control device 10. The gate drive unit (20, 22, S1, S2, R1, R2) includes a gate turn-on wiring 20, a gate turn-off wiring 22, first and second switching elements S1, S2, and first and second resistors R1, R2.

One end of the gate turn-on wiring 20 and one end of the gate turn-off wiring 22 are connected to the gate Sg of the switching element SM. That is, the gate Sg of the switching element SM is connected to a connection node N1 of the gate turn-on wiring 20 and the gate turn-off wiring 22. A drain Sd1 of the first switching element S1 is connected to the other end of the gate turn-on wiring 20. A source Ss1 of the first switching element S1 is connected to a power supply potential Vcc. The first switching element S1 is, for example, a p-channel type MOSFET. The control device 10 is connected to a gate of the first switching element S1 through an operational amplifier 12. The first switching element S1 is switched between an on state and an off state based on a control signal sig1 input from the control device 10. The first resistor R1 is arranged in the gate turn-on wiring 20, and the first resistor R1 is provided between the gate Sg and the first switching element S1. A charging rate of an electric charge in the gate Sg of the switching element SM is adjusted by the first resistor R1. That is, the first resistor R1 adjusts the turn-on speed of the switching element SM. The first switching element S1 is not limited to the above-described p-channel type MOSFET, and may be other switching element, for example, an n-channel type MOSFET.

In the gate turn-off wiring 22, the second switching element S2 and the second resistor R2 are arranged. A drain Sd2 of the second switching element S2 and the gate Sg of the switching element SM are connected by the gate turn-off wiring 22. The second switching element S2 is, for example, an n-channel type MOSFET. The control device 10 is connected to a gate of the second switching element S2 through an operational amplifier 14. The second switching element S2 is switched between an on state and an off state based on a control signal sig2 input from the control device 10. With this, the gate turn-off wiring 22 is switched between an electric conduction state and a non-electric conduction state. In the gate turn-off wiring 22 in a range of connection of the second switching element S2 and the gate Sg of the switching element SM, the second resistor R2 is arranged. A discharging rate of an electric charge from the gate Sg of the switching element SM is adjusted by the second resistor R2. That is, the second resistor R2 adjusts the turn-off speed of the switching element SM. In this example, a resistance value of the second resistor R2 is different from a resistance value of the first resistor R1. Accordingly, the turn-on speed and the turn-off speed of the switching element SM are adjusted so as to be different from each other. The other end of the gate turn-off wiring 22 is connected to a ground potential. A source Ss2 of the second switching element S2 is connected to the ground potential through the gate turn-off wiring 22. The second switching element S2 is not limited to the above-described n-channel type MOSFET, and may be other switching elements, for example, a p-channel type MOSFET. The resistance values of the first resistor R1 and the second resistor R2 may be identical.

The charge pump unit 2 has one end connected to the gate drive unit (20, 22, S1, S2, R1, R2) and the other end connected to the ground potential. The charge pump unit 2 generates a negative voltage using a pulse signal output from the gate drive unit (20, 22, S1, S2, R1, R2) to the switching element SM. The charge pump unit 2 includes a first capacitor C1, a second capacitor C2, a fourth diode D4, and a fifth diode D5. A first wiring 24 and a second wiring 26 are connected to a terminal 16 of the first capacitor C1. Specifically, the terminal 16 of the first capacitor C1 is connected to a connection node N2 of the first wiring 24 and the second wiring 26. The first wiring 24 is connected to the gate turn-on wiring 20 and the terminal 16 of the first capacitor C1 at a connection node N3. The connection node N3 is arranged between the first switching element S1 and the first resistor R1. The second wiring 26 is connected to the gate turn-off wiring 22 and the terminal 16 of the first capacitor C1 at a connection node N4. The connection node N4 is arranged between the second switching element S2 and the second resistor R2. A third resistor R3 is arranged in the first wiring 24. A fourth resistor R4 is arranged in the second wiring 26. The resistance values of the third resistor R3 and the fourth resistor R4 are smaller than the resistance values of the first resistor R1 and the second resistor R2.

A fourth wiring 28 and a fifth wiring 30 are connected to a terminal 17 of the first capacitor. Specifically, the terminal 17 of the first capacitor C1 is connected to a connection node N5 of the fourth wiring 28 and the fifth wiring 30. The fourth wiring 28 is connected to the gate turn-off wiring 22 and the terminal 17 of the first capacitor C1 at a connection node N6. The connection node N6 is arranged between the second switching element S2 and the ground potential. The fifth wiring 30 is connected to the gate turn-off wiring 22 and the terminal 17 of the first capacitor at a connection node N7. The connection node N7 is positioned between the second switching element S2 and the connection node N6. The fourth diode D4 is arranged in the fourth wiring 28. An anode terminal of the fourth diode D4 is connected to the terminal 17 of the first capacitor C1, and a cathode terminal of the fourth diode D4 is connected to the gate turn-off wiring 22. The fifth diode D5 and the second capacitor C2 are arranged in the fifth wiring. An anode terminal of the fifth diode D5 is connected to a terminal 19 of the second capacitor C2, and a cathode terminal of the fifth diode D5 is connected to the terminal 17 of the first capacitor C1. A terminal 18 of the second capacitor C2 is connected to the gate turn-off wiring 22. The second capacitor C2 outputs a negative voltage using an electric charge charged in the first capacitor C1 (described below).

The control device 10 controls the on and off states of the first switching element S1 and the second switching element S2. That is, the control device 10 outputs the control signal sig1 to the first switching element S1 to switch the on and off states of the first switching element S1. The control device 10 outputs the control signal sig2 to the second switching element S2 to switch the on and off states of the second switching element S2. As described below, the control device 10 turns on the first switching element S1 and turns off the second switching element S2, thereby turning on the switching element SM. The control device 10 turns off the second switching element S2 and turns on the first switching element S1, thereby turning off the switching element SM.

Figure 2:
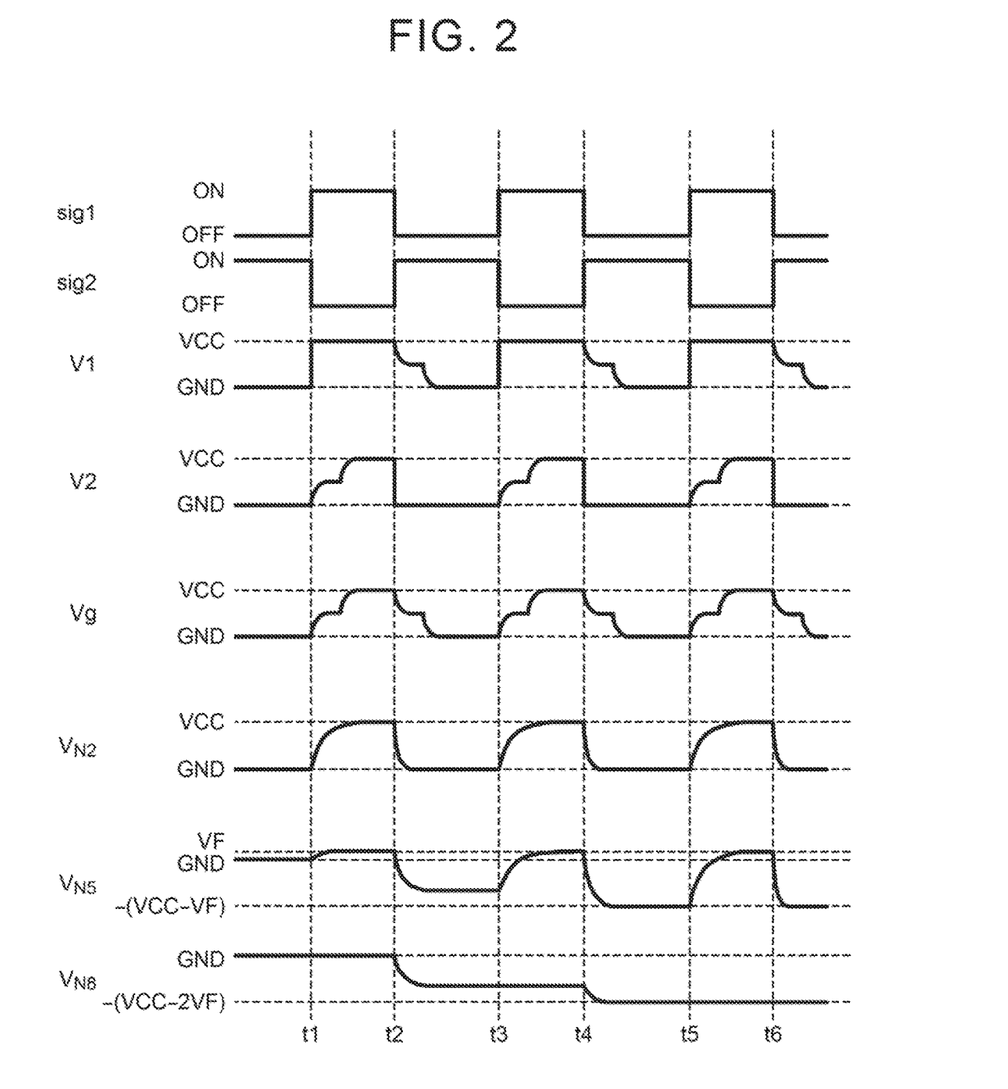
FIG. 2 is a timing chart showing changes of signals at respective points of the switching circuit of Example 1.

Next, the operation of the switching circuit 1 of this example will be described referring to FIG. 2. First, the control device 10 turns on the first switching element S1 and turns off the second switching element S2 (t1). For this reason, a drain voltage V1 of the first switching element S1 increases to the power supply potential Vcc. With this, a current flows in the gate Sg of the switching element SM through the first resistor R1, and an electric charge is charged in the gate Sg. With the charging of the gate Sg, a gate voltage Vg increases, and the switching element SM is turned on. Simultaneously with the charging in the gate Sg, the first capacitor C1 is charged through the first wiring 24 (third resistor R3). If the first capacitor C1 is completely charged, a voltage $V_{N2}$ of the connection node N2 becomes Vcc. As a charging path of the first capacitor C1, there is also a path (a path using the second wiring 26) passing through the resistors R1, R2, and R4. However, in this example, since the resistance value of the third resistor R3 is sufficiently smaller than the combined resistance value of the path passing through the resistors R1, R2, R4, a charging path (first wiring 24) passing through the third resistor R3 becomes dominant. For this reason, it can be said that the first capacitor C1 is charged through the first wiring 24. If the amount Q1 of electric charge charged in the first capacitor C1 through the first wiring 24 is greater than the amount Q2 of electric charge charged in the first capacitor C1 through the second wiring 26, an increase in switching loss is suppressed. For example if the ratio of the amount Q1 of electric charge and the amount Q2 of electric charge is set to 2, the charging efficiency of the gate Sg of the switching element SM becomes 75%. That is, it is possible to suppress a decrease in efficiency to 25%. If the ratio of the amount Q1 of electric charge and the amount Q2 of electric charge is set to 10 or 100, the charging efficiency of the gate Sg can become 92% or 99% respectively. In this way, the ratio of the amount Q1 of electric charge and the amount Q2 of electric charge is appropriately adjusted, whereby it is possible to suitably suppress an increase in switching loss. If the gate Sg and the first capacitor C1 are completely charged, a drain voltage V2 of the second switching element S2 and the voltage Vg of the gate Sg become Vcc, and a voltage $V_{N5}$ of the connection node N5 becomes VF. Here, VF is a forward voltage of the fourth diode D4. Accordingly, an electric charge according to a potential difference (Vcc−VF) is charged in the first capacitor C1.

Next, the control device 10 turns on the second switching element S2 and turns off the first switching element S1 (t2). With this, the drain voltage V2 of the second switching element S2 decreases to the ground potential. At this time, an electric charge charged in the gate Sg of the switching element SM is discharged through the second resistor R2. As a result, the gate voltage Vg decreases, and the switching element SM is turned off. An electric charge charged in the first capacitor C1 is discharged through the second wiring 26 (fourth resistor R4). As a result, the voltage of the connection node N4 decreases, and the voltage $V_{N2}$ of the connection node N2 also decreases. As a discharging path of the first capacitor C1, there is also a path passing through the first wiring 24 (resistors R3, R1, R2). However, since the resistance value of the fourth resistor R4 is sufficiently smaller than the combined resistance value of the path passing through the resistors R3, R1, R2, a discharging path passing through the fourth resistor R4 becomes dominant. For this reason, it can be said that the first capacitor C1 is discharged through the second wiring 26. If the amount Q3 of electric charge discharged from the first capacitor C1 through the second wiring 26 is greater than the amount Q4 of electric charge discharged from the first capacitor C1 through the first wiring 24, an increase in switching loss is suppressed. The ratio of the amount Q3 of electric charge and the amount Q4 of electric charge is adjusted like the amount Q1 of electric charge and the amount Q2 of electric charge described above, whereby it is possible to suitably suppress an increase in switching loss. At a time t2, the first capacitor C1 holds an electric charge according to a potential difference (Vcc−VF). For this reason, if an electric charge charged in the first capacitor C1 is discharged, the voltage of the connection node N5, to which the first capacitor C1 is connected, decreases. A negative electric charge moves from the first capacitor C1 to the second capacitor, and as a result, a voltage $V_{N8}$ of a connection node N8 decreases. A thus-generated negative voltage is held in the second capacitor C2.

Hereinafter, similarly, if the control device 10 turns on the first switching element S1 (t3), the drain voltage V1 of the first switching element S1 increases to the power supply potential Vcc. With this, the gate voltage of the gate Sg of the switching element SM increases, the switching element SM is turned on, and the first capacitor C1 is charged through the first wiring 24 (third resistor R3). If the gate Sg and the first capacitor C1 are completely charged, the voltage $V_{N2}$ of the connection node N2 becomes Vcc, and the voltage $V_{N5}$ of the connection node N5 increases to VF. Accordingly, an electric charge according to a potential difference (Vcc−VF) is charged in the first capacitor C1 again.

Subsequently, if the control device 10 turns on the second switching element S2 (t4), the drain voltage V2 of the second switching element S2 decreases to the ground potential. At this time, an electric charge charged in the gate Sg of the switching element SM is discharged through the second resistor R2. As a result, the gate voltage Vg decreases, and the switching element SM is turned off. An electric charge charged in the first capacitor C1 is also discharged through the second wiring 26 (fourth resistor R4), the voltage of the connection node N4 decreases, and the voltage $V_{N2}$ of the connection node N2 decreases. Since the first capacitor C1 holds an electric charge according to the potential difference (Vcc−VF), the voltage $V_{N5}$ of the connection node N5, to which the first capacitor C1 is connected, further decreases. A negative electric charge moves from the first capacitor C1 to the second capacitor C2, and the voltage $V_{N8}$ of the connection node N8 further decreases. A generated negative voltage is held in the second capacitor C2.

As described above, the on and off operations of the first switching element S1 and the second switching element S2 are repeatedly performed, whereby the negative voltage held in the second capacitor C2 finally converges on −(Vcc−2VF).

In the switching circuit 1 of this example, the first wiring 24 is used when charging the first capacitor C1, and the second wiring 26 is used when discharging the first capacitor C1. For this reason, it is possible to suppress a decrease in switching speed of the switching element SM, and to suppress an increase in switching loss of the switching element SM. Since the combined resistance value at the time of turn-on and the combined resistance value at the time of turn-off can be adjusted independently, it is possible to adjust gate currents at the time of charging and at the time of discharging respectively.

In this example, although the switching circuit 1 includes the third resistor R3 and the fourth resistor R4, the technique disclosed in this specification is not limited to this form. For example, the switching circuit may have a configuration in which only the third resistor R3 is arranged in the first wiring 24. Even in such a configuration, if the resistance values of the resistors R1, R2, R3 are adjusted such that the first capacitor C1 is charged through the first wiring 24 (third resistor R3) at the time of charging of the first capacitor C1 (when the first switching element S1 is turned on) and is discharged through the second wiring 26 at the time of discharging of the first capacitor C1 (when the first switching element is turned off), as in Example 1, it is possible to suppress an increase in switching loss. For example, the switching circuit may have a configuration in which only the fourth resistor R4 is arranged in the second wiring 26. Even in such a configuration, if the resistance values of the resistors R1, R2, R4 are adjusted such that the first capacitor C1 is charged through the first wiring 24 at the time of charging of the first capacitor C1 (when the first switching element S1 is turned on) and is discharged through the second wiring 26 (fourth resistor R4) at the time of discharging of the first capacitor C1 (when the first switching element is turned off), as in Example 1, it is possible to suppress an increase in switching loss.

The circuit configuration of the charge pump unit 2 is not limited to the configuration disclosed in the above-described example, and various known circuit configuration in the related art can be used. In the above-described example, although the fourth diode D4 or the second capacitor C2 of the charge pump unit 2 is connected to the ground potential through the gate turn-off wiring 22, the technique disclosed in this specification is not limited to this form, and the fourth diode D4 or the second capacitor C2 may be directly connected to the ground potential.

Figure 3:
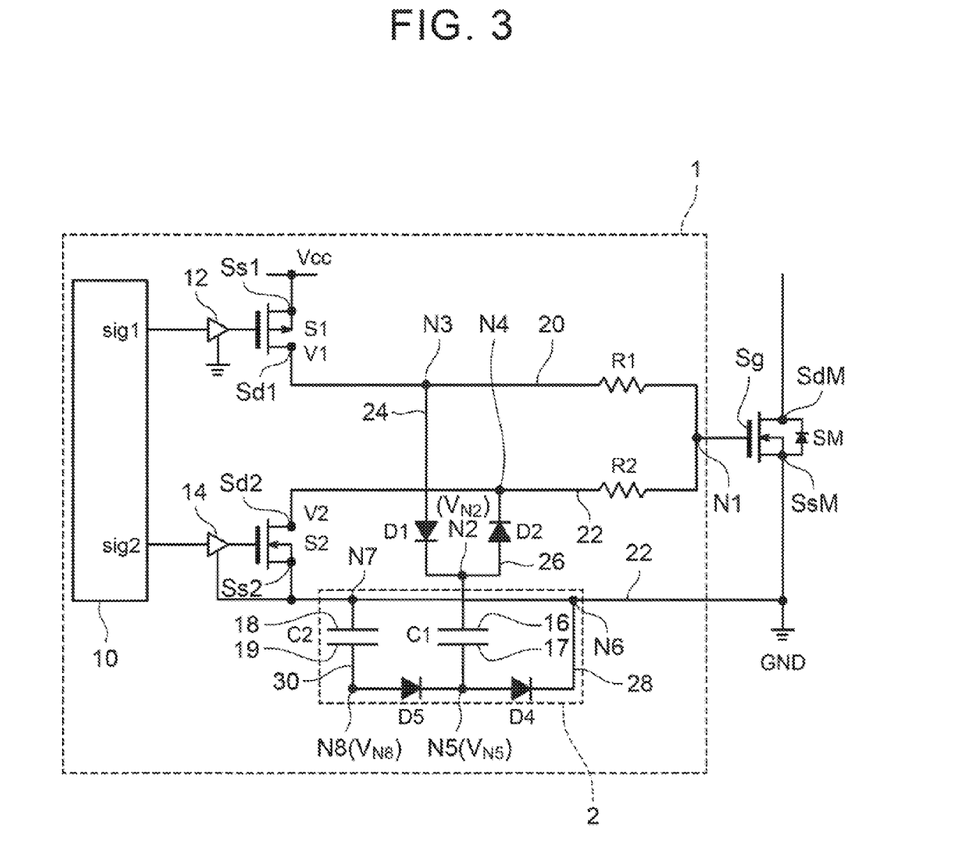
FIG. 3 is a diagram showing the configuration of a switching circuit of Example 2.

Next, a switching circuit of Example 2 will be described referring to FIG. 3. Hereinafter, only a difference from Example 1 will be described, and detailed description of the same configurations as those in Example 1 will not be repeated.

The switching circuit of this example includes a diode unit instead of the resistor unit of Example 1. Specifically, the switching circuit of this example has a difference in that diodes D1, D2 are provided instead of the resistors R3, R4 of Example 1, and in regards to other points, the same configurations are used. That is, a first diode D1 is arranged in the first wiring 24, and a second diode D2 is arranged in the second wiring 26. An anode terminal of the first diode D1 is connected to the gate turn-on wiring 20, and a cathode terminal of the first diode D1 is connected to the first capacitor C1. An anode terminal of the second diode D2 is connected to the first capacitor C1, and a cathode terminal of the second diode D2 is connected to the gate turn-off wiring 22.

Figure 4:
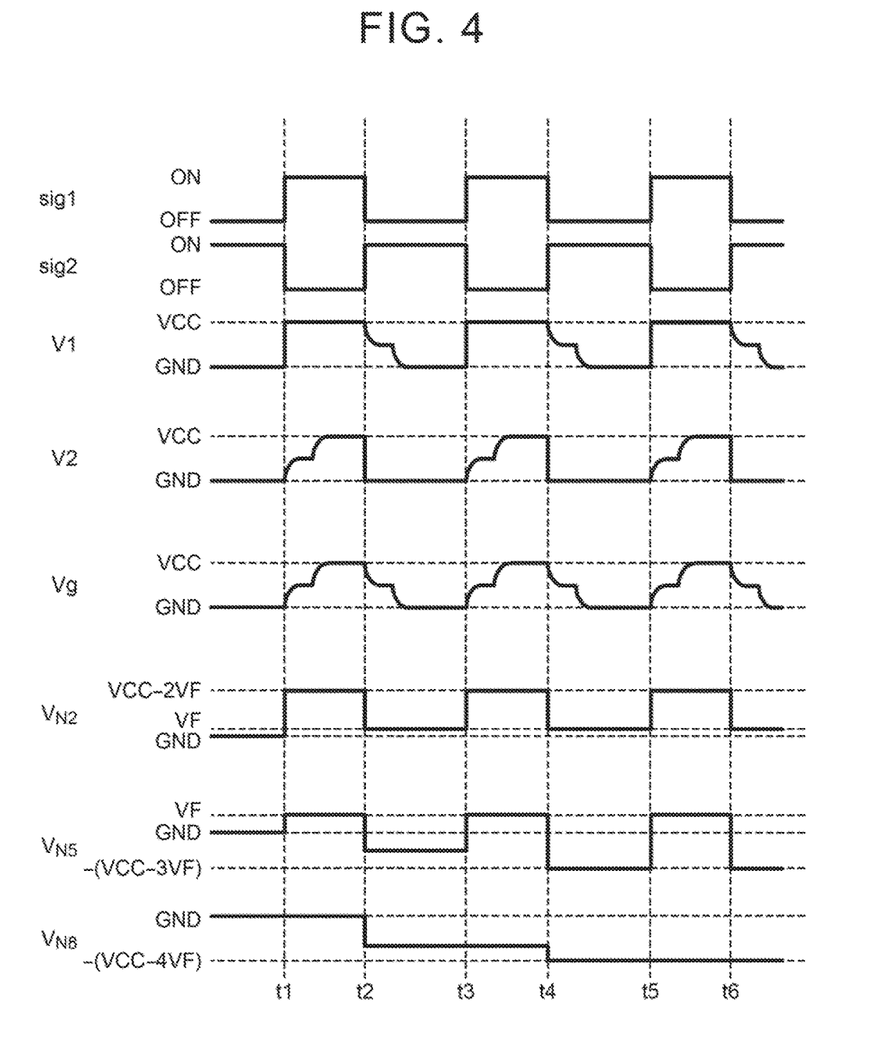
FIG. 4 is a timing chart showing changes of signals at respective points of the switching circuit of Example 2.

The operation of the switching circuit of Example 2 will be described referring to FIG. 4. If the first switching element S1 is turned on and the second switching element S2 is turned off by the control device 10 (t1), the drain voltage V1 of the first switching element S1 increases to the power supply potential Vcc. With this, the gate voltage of the switching element SM increases, the switching element SM is turned on, and the first capacitor C1 is charged through the first diode D1. At this time, the voltage $V_{N2}$ of the connection node N2 becomes Vcc−VF1. VF1 is a forward voltage of the first diode D1. Since the second diode D2 is arranged in the second wiring 26, a charging path to the first capacitor C1 is only a path (first wiring 24) passing through the first diode D1. If the forward voltage VF1 of the first diode D1 and a forward voltage VF4 of the fourth diode D4 are the same forward voltage VF, an electric charge according to a potential difference (Vcc−2VF) is charged in the first capacitor C1, and the voltage $V_{N5}$ of the connection node N5 becomes VF.

Next, if the second switching element S2 is turned on (the first switching element S1 is turned off) (t2), the drain voltage V2 of the second switching element S2 decreases to the ground potential. At this time, an electric charge is discharged from the gate Sg of the switching element SM through the second resistor R2, the gate voltage Vg decreases, and the switching element SM is turned off. An electric charge from the first capacitor C1 is discharged through the second wiring 26 (second diode D2), the voltage of the connection node N4 decreases, and the voltage $V_{N2}$ of the connection node N2 decreases to VF. Since the first diode D1 is arranged in the first wiring 24, a discharging path of the first capacitor C1 is only a path passing through the second wiring (second diode D2). Since the first capacitor C1 holds an electric charge according to the potential difference (Vcc−2VF), the voltage $V_{N5}$ of the connection node N5, to which the first capacitor C1 is connected, decreases. A negative electric charge moves from the second capacitor C2 to the first capacitor C1, whereby the voltage $V_{N8}$ of the connection node N8 decreases. A generated negative voltage is held in the second capacitor C2.

As described above, the on and off operations of the first switching element S1 and the second switching element S2 are repeatedly performed, whereby the voltage $V_{N5}$ of the connection node N5 decreases to −(Vcc−3VF). The negative voltage held in the second capacitor C2 finally converges on −(Vcc−4VF). However, in the above description, all of the forward voltages of the diodes D1, D2, D4, D5 are equally VF.

In the switching circuit of this example, when the first switching element S1 is turned on, a current flows in the first capacitor C1 through the first diode D1 with a low impedance. For this reason, it is possible to make the charging rate of the first capacitor C1 faster than in Example 1. Immediately after the charging of the first capacitor C1 is started, the gate voltage Vg of the switching element SM becomes a mirror voltage. At this time, if the forward voltages of the diodes D1, D2 are not secured, a current does not flow in the diodes D1, D2. Accordingly, a current flows only in the first resistor R1. For this reason, it is possible to reduce the control factors of the turn-on speed of the switching element SM. That is, the turn-on speed of the switching element SM is determined only by the first resistor R1, whereby it is possible to suppress variation in turn-on speed of the switching element SM. Furthermore, since it is possible to reduce the influence of the charging of the first capacitor C1 on the turn-on of the switching element SM, it is possible to suppress an increase in switching-on loss of the switching element SM.

When the second switching element S2 is turned on, a discharging path of the first capacitor C1 is only the second wiring 26, and only the second diode D2 is arranged in the second wiring 26. For this reason, an electric charge of the first capacitor C1 is discharged with low impedance. For this reason, the discharging rate of the first capacitor C1 is made faster than in Example 1. Immediately after the voltage $V_{N2}$ of the connection node N2 starts to decrease, the gate voltage Vg of the switching element SM becomes a mirror voltage. At this time, if the forward voltages of the diodes D1, D2 are not secured, a current does not flow in the diodes D1, D2. Accordingly, a current discharged from the gate Sg flows only in the second resistor R2. For this reason, it is possible to reduce the control factors of the turn-off speed of the switching element SM. That is, the turn-off speed of the switching element SM is determined only by the second resistor R2, and it is possible to suppress variation in turn-off speed of the switching element SM. Furthermore, since it is possible to reduce the influence of the discharging of the first capacitor C1 on the turn-off of the switching element SM, it is possible to suppress switching-off loss of the switching element SM.

Figure 5:
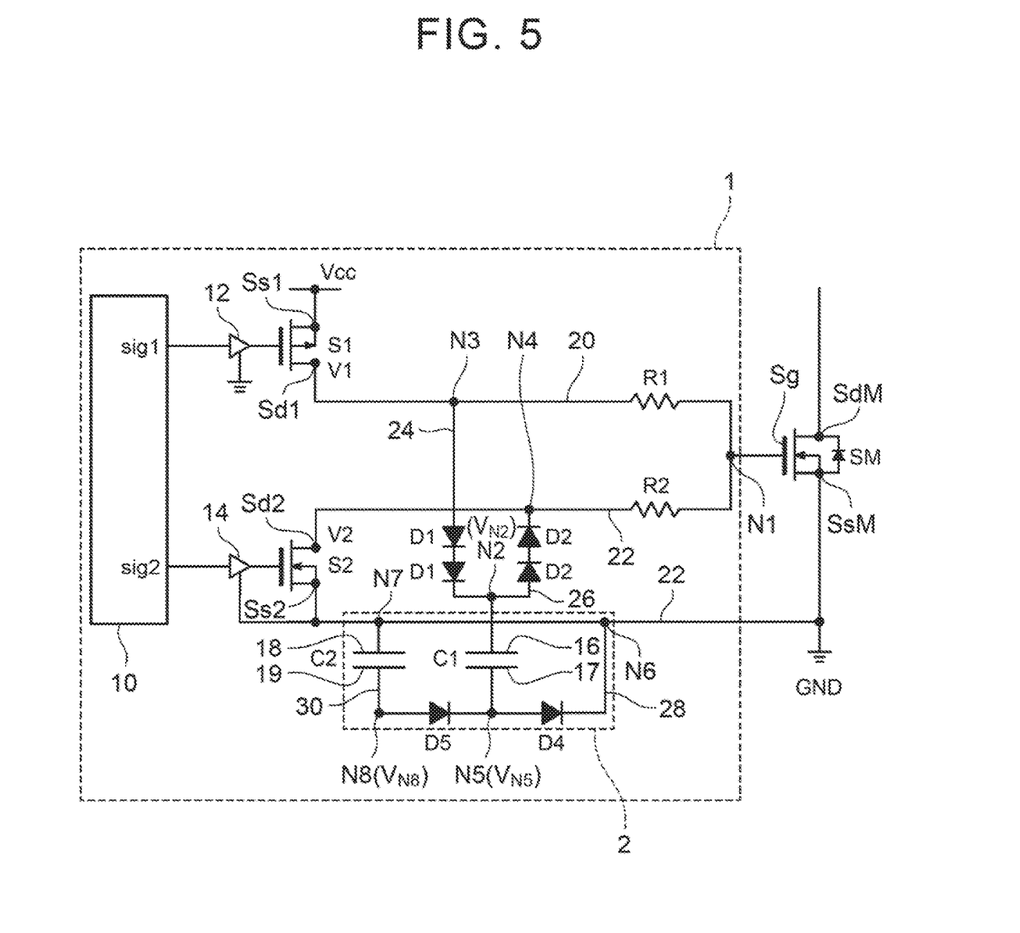
FIG. 5 is a diagram showing the configuration of a modification example of the switching circuit of Example 2.

The configuration of the diode unit arranged in the first wiring 24 and the second wiring 26 is not limited to the above-described example. For example, as shown in FIG. 5, two first diodes D1, D1 may be arranged in the first wiring 24 in series, and two second diodes D2, D2 may be arranged in the second wiring 26 in series. In such a configuration, an anode terminal of one first diode D1 is connected to the gate turn-on wiring 20, and a cathode terminal of the other first diode D1 is connected to the first capacitor C1. An anode terminal of one second diode D2 is connected to the first capacitor C1, and a cathode terminal of the other second diode D2 is connected to the gate turn-off wiring 22. According to such a configuration, the operation of the switching circuit is repeated, whereby it is possible to increase the negative voltage held in the second capacitor C2 to −(Vcc−6VF). Furthermore, n first diodes D1 are arranged in series, and n second diodes D2 are arranged in series, whereby it is possible to generate a desired negative voltage. The negative voltage held in the second capacitor C2 at this time finally becomes −{Vcc−(2n+2)VF}.

In the above-described example, although the diode is arranged in each of the first wiring 24 and the second wiring 26, the disclosure is not limited to such a form. For example, if the first capacitor C1 is substantially charged through the first wiring 24 when the first switching element S1 is turned on, and the first capacitor C1 is substantially discharged through the second wiring 26 when the second switching element S2 is turned on, a diode may be arranged in either of the first wiring 24 or the second wiring 26. Here, "substantially charged" means that the amount of electric charge flowing in the first wiring 24 becomes greater than the amount of electric charge flowing in the second wiring 26. The ratio of the amount of electric charge flowing in the first wiring 24 and the amount of electric charge flowing in the second wiring 26 is appropriately adjusted like the amount Q1 of electric charge and the amount Q2 of electric charge in Example 1 described above, whereby the same functional effects as those in the switching circuit of Example 1 can be obtained.

Figure 6:
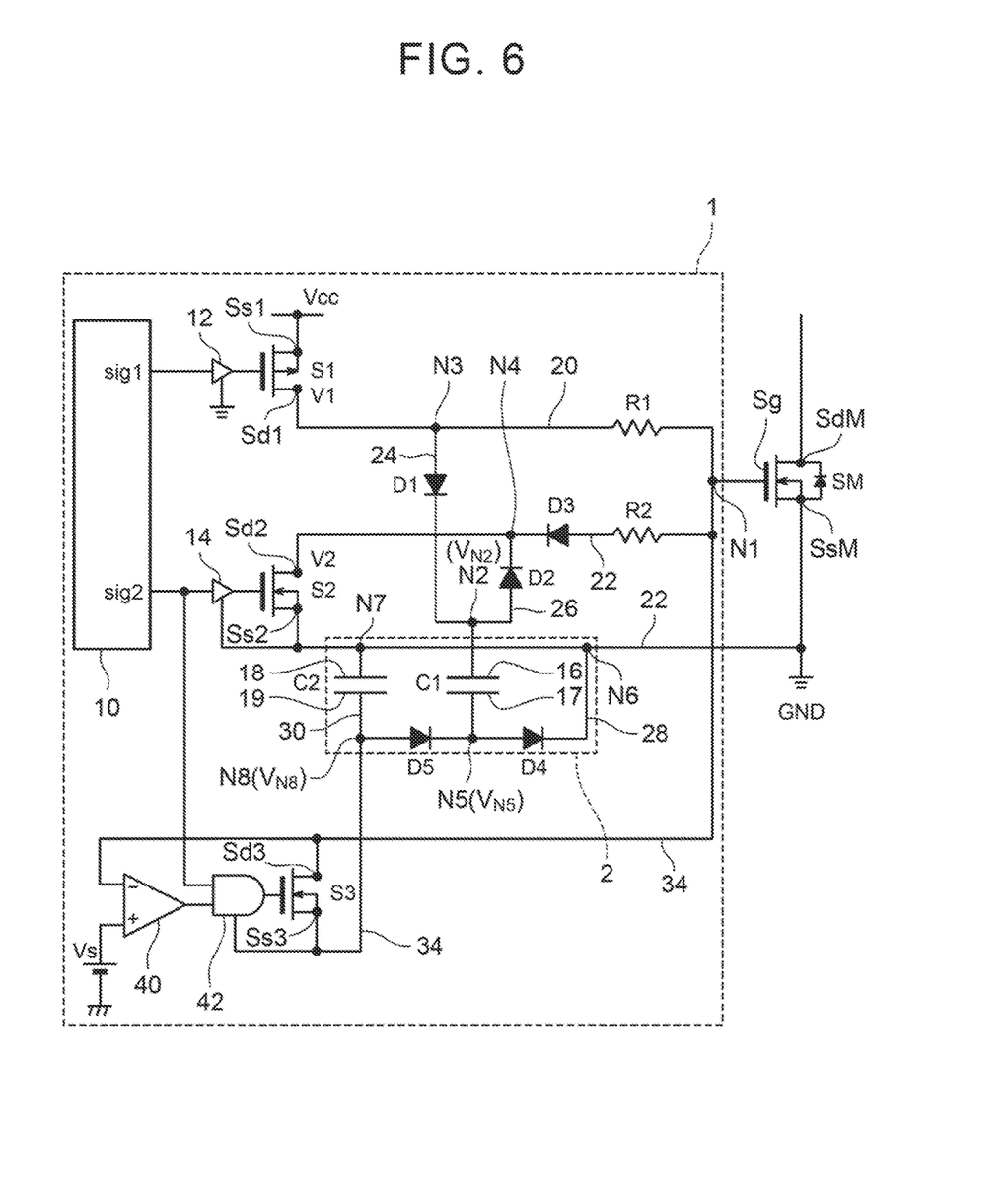
FIG. 6 is a diagram showing the configuration of a switching circuit of Example 3.

Next, a switching circuit of Example 3 will be described referring to FIG. 6. Hereinafter, only a difference from Example 2 will be described, and detailed description of the same configurations as those in Example 2 will not be repeated. The switching circuit of this example further includes a third diode D3, a third wiring 34, and a third switching element S3.

The third diode D3 is arranged in the gate turn-off wiring 22. An anode terminal of the third diode D3 is connected to the gate Sg of the switching element SM, and a cathode terminal of the third diode D3 is connected to the second switching element S2. In more detail, the third diode D3 is arranged in the gate turn-off wiring 22 in a range between the second resistor R2 and the connection node N4.

The third wiring 34 connects one terminal 19 (in detail, the connection node N8) of the second capacitor C2 and the gate Sg of the switching element SM. The third switching element S3 is arranged in the third wiring 34, and the third wiring 34 is switched between an electric conduction state and a non-electric conduction state. In detail, a drain Sd3 of the third switching element S3 is connected to the gate Sg through the third wiring 34, and a source Ss3 of the third switching element S3 is connected to the second capacitor C2 (in detail, the connection node N8) through the third wiring 34.

A gate of the third switching element S3 is connected to a reference potential Vs through an AND circuit 42 and an operational amplifier 40 (+ terminal). The control signal sig2 from the control device 10 is input to the gate of the third switching element S3 through the AND circuit 42. The operational amplifier 40 (− terminal) is connected to the gate Sg of the switching element SM through the third wiring 34.

In the switching circuit of Example 3, in a case of turning off the switching element SM, first, the second switching element S2 is turned on, and the third switching element S3 is turned on when the gate Sg decreases to the reference potential Vs. Hereinafter, the operation of the switching circuit of this example is specifically described referring to FIG. 7. The switching circuit of this example is different from that in Example 1 in that the third switching element S3 is turned on (in the drawing, time t2', t4', t6') after the switching element SM is turned off (after the first switching element S1 is turned off (after the second switching element S2 is turned on)), and other operations are the same as those in Example 2.

Figure 7:
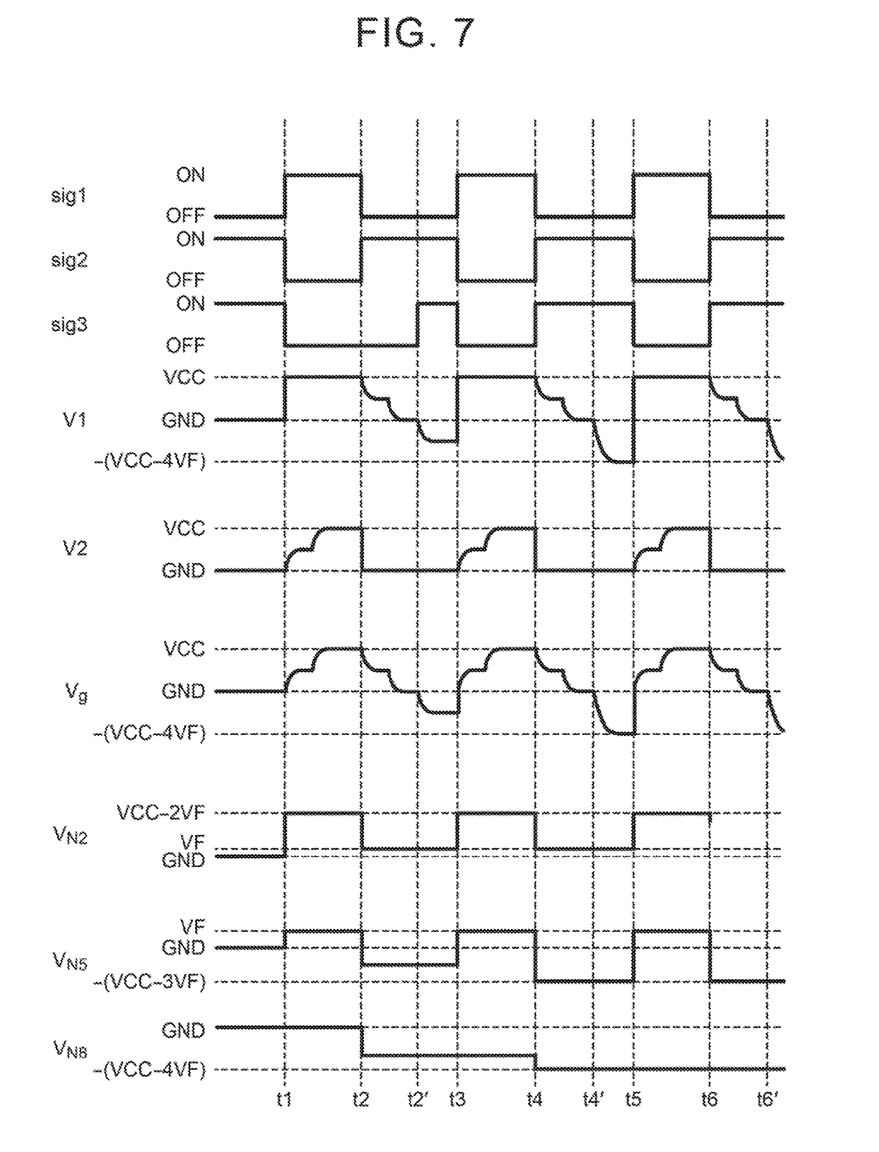
FIG. 7 is a timing chart showing changes of signals at respective points of the switching circuit of Example 3.

When the first switching element S1 is turned off (t2), the control signal sig2 is input to the AND circuit 42. Thereafter, if the gate voltage Vg of the switching element SM decreases to the reference potential Vs, a voltage (that is, the gate voltage Vg) input to (− terminal) of the operational amplifier 40 is lower than the reference potential Vs. As a result, a signal output from the operational amplifier 40 is changed from the off state to the on state, and a signal changed to the on state is input to the AND circuit 42. If the control signal sig2 input from the control device 10 is in the on state and the signal input from the operational amplifier 40 is brought into the on state (time t2'), the AND circuit 42 turns on the switching element S3. The switching element S3 is turned on, whereby the negative voltage held in the second capacitor C2 is applied to the gate Sg of the switching element SM and the gate Sg decreases to the negative voltage. If the switching element S3 is turned on, while the gate Sg of the switching element SM becomes the negative voltage, the third diode D3 is arranged in the gate turn-off wiring 22. For this reason, a current does not flow toward the gate Sg of the switching element SM through the gate turn-off wiring 22.

As described above, after the second switching element S2 is turned off, the third switching element S3 is turned on, whereby it is possible to apply a negative potential −(Vcc−2VF) to the gate Sg when the switching element SM is turned off.

In this example, after the switching element SM is turned off, it is possible to make the gate voltage Vg become the negative voltage. For this reason, even in a case where a surge voltage or noise occurs in the switching element SM, it is possible to prevent the switching element SM from being erroneously turned on. The configuration of this example may use the switching circuit of Example 1.

In this example, although the third diode D3 is arranged between the second resistor R2 and the connection node N4, the disclosure is not limited thereto, and for example, the third diode D3 may be arranged between the connection node N4 and the second switching element S2.

Figure 8:
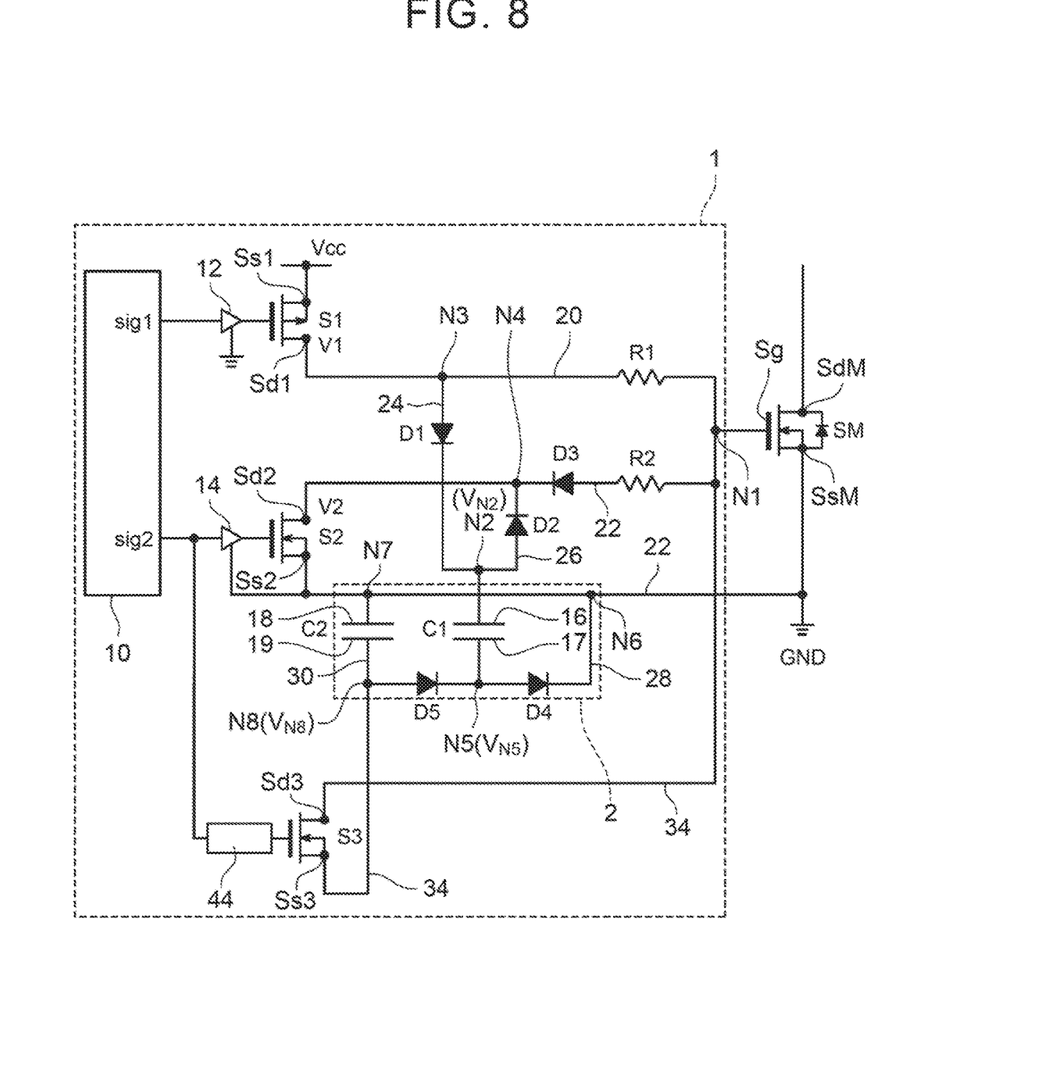
FIG. 8 is a diagram showing the configuration of a modification example of the switching circuit of Example 3.

As shown in FIG. 8, a counter circuit 44 may be used in order to control the timing for turning on the third switching element S3. The counter circuit 44 starts a count operation if the second switching element S2 is turned on, and the third switching element S3 is turned on when a predetermined time has elapsed after the second switching element S2 is turned on. With such a configuration, it is possible to apply the negative voltage to the gate Sg of the switching element SM at an appropriate timing.

The technical elements disclosed in this specification are listed below. The respective technical elements are useful independently.

In a switching element of an example disclosed in this specification, a resistor unit may include a third resistor which is arranged in the first wiring, and a fourth resistor which is arranged in the second wiring. In this configuration, the adjustment of the resistance values of the third resistor and the fourth resistor enables to more easily switch a path through which an electric charge charged in and discharged from the first capacitor when turning on and off the voltage-driven switching element flows.

A switching circuit of an example disclosed in this specification which drives a voltage-driven switching element, and may include a first switching element configured to switch the on and off states of the voltage-driven switching element, a gate turn-on wiring configured to connect the first switching element and the gate of the voltage-driven switching element, a first resistor arranged in the gate turn-on wiring, a gate turn-off wiring connected to a gate of the voltage-driven switching element, a second switching element arranged in the gate turn-off wiring and configured to switch the gate turn-off wiring between an electric conduction state and a non-electric conduction state, a second resistor arranged in the gate turn-off wiring in a range of connection of the second switching element and the gate of the voltage-driven switching element, a charge pump unit having a first capacitor, and a second capacitor configured to output a negative voltage using an electric charge charged in the first capacitor, a first wiring configured to connect the gate turn-on wiring and one terminal of the first capacitor in a range of connection of the first switching element and the first resistor, a second wiring configured to connect the gate turn-off wiring and one terminal of the first capacitor in a range of connection of the second switching element and the second resistor, and a diode unit arranged in at least one of the first wiring or the second wiring and configured to charge the first capacitor through the first wiring when the first switching element is turned on and to discharge the first capacitor through the second wiring when the second switching element is turned on. In this configuration, a path through which an electric charge charged in and discharged from the first capacitor is switched between the first wiring and the second wiring by the rectification action of the diode unit. With this, it is possible to suppress a decrease in switching speed of the voltage-driven switching element and to suppress an increase in switching loss.

In the switching element of an example disclosed in this specification, the diode unit may include a first diode arranged in the first wiring and having an anode terminal connected to the gate turn-on wiring and a cathode terminal connected to the first capacitor, and a second diode arranged in the second wiring and having an anode terminal connected to the first capacitor and a cathode terminal connected to the gate turn-off wiring. In this configuration, it is possible to easily switch a path, through which an electric charge charged in and discharged from the first capacitor flows, by the rectification action of the first diode and the second diode.

The switching circuit of an example disclosed in this specification may further include a third diode arranged in the gate turn-off wiring and having an anode terminal connected to the gate of the voltage-driven switching element and a cathode terminal connected to the second switching element, a third wiring configured to connect one terminal of the second capacitor configured to output the negative voltage and the gate of the voltage-driven switching element, and a third switching element configured to switch the third wiring between an electric conduction state and a non-electric conduction state. In a case of turning off the voltage-driven switching element, the second switching element may be turned on, and the third switching element may be turned on when the gate of the voltage-driven switching element decreases to a reference potential. In this configuration, after the voltage-driven switching element is turned off, it is possible to apply the negative voltage to the gate of the voltage-driven switching element. For this reason, even in a case where surging or noise occurs, it is possible to prevent the voltage-driven switching element from being erroneously turned on.

In the switching circuit of an example disclosed in this specification, the charge pump unit may further include a fourth wiring configured to connect the gate turn-off wiring and the other terminal of the first capacitor in a range of connection of the second switching element and a ground potential, a fifth wiring having the second capacitor arranged therein and configured to connect the gate turn-off wiring in a range of connection of a connection point between the fourth wiring and the gate turn-off wiring and the second switching element to the other terminal of the first capacitor through the second capacitor, a fourth diode arranged in the fourth wiring and having an anode terminal connected to the other terminal of the first capacitor and a cathode terminal connected to the gate turn-off wiring, and a fifth diode arranged in the fifth wiring and having an anode terminal connected to one terminal of the second capacitor and a cathode terminal connected to the other terminal of the first capacitor. In this configuration, since the charge pump unit is connected to the ground potential using the gate turn-off wiring, it is possible to suitably provide a charge pump in the switching circuit.

While the "resistor unit" described above is configured to charge the first capacitor through the first wiring when the first switching element is turned on, a part of the electric charge charged in the first capacitor may be charged through the second wiring. That is, the "resistor unit" may be configured such that the amount of electric charge charged in the first capacitor through the first wiring becomes larger than the amount of electric charge charged in the first capacitor through the second wiring. The "resistor unit" described above is configured to discharge an electric charge in the first capacitor through the second wiring when the second switching element is turned on, a part of the electric charge of the first capacitor may be discharged through the first wiring. That is, the "resistor unit" may be configured such that the amount of electric charge discharged from the first capacitor through the second wiring becomes larger than the amount of electric charge discharged from the first capacitor through the first wiring.

In a configuration of an example disclosed in this specification, a power conversion circuit including a voltage-driven switching element, and a switching circuit configured to drive the voltage-driven switching element may be provided.

While specific examples of the disclosure have been described in detail, these examples are for illustrative purposes and are not intended to limit the disclosure. The disclosure includes various modifications and alterations of the specific examples illustrated above.

The technical elements described in this specification or the drawings exert technical utility independently or in combination of some of them, and the combination is not limited to one described in the claims as filed. The technology illustrated in this specification or the drawings achieves a plurality of objects at the same time, and has technical utility by achieving one of these objects.

What is claimed is:

1. A switching circuit comprising:
a first switching element;
a first gate turn-on wiring connected to the first switching element;
a first resistor connected to the first gate turn-on wiring;
a second gate turn-on wiring connecting the first resistor and a gate of a voltage-driven switching element;
a second switching element;
a first gate turn-off wiring connected to the second switching element;
a second resistor connected to the first gate turn-off wiring;
a second gate turn-off wiring connecting the second resistor and the gate of the voltage-driven switching element;
a charge pump unit including
 a first capacitor, and
 a second capacitor configured to output a negative voltage using an electric charge charged in the first capacitor;
a first wiring connecting the first gate turn-on wiring and a first terminal of the first capacitor;
a second wiring connecting the first gate turn-off wiring and the first terminal of the first capacitor; and
a charge pump charging-discharging unit disposed in the first wiring or the second wiring, the charge pump charging-discharging unit configured to charge the first capacitor through the first wiring when the first switching element is turned on, and the charge pump charging-discharging unit configured to discharge the first capacitor through the second wiring when the second switching element is turned on.

2. The switching circuit according to claim 1, wherein the charge pump charging-discharging unit includes:
   a third resistor disposed in the first wiring; and
   a fourth resistor arranged in the second wiring.

3. The switching circuit according to claim 1, wherein the charge pump charging-discharging unit includes:
   a first diode disposed in the first wiring, the first diode including a first anode terminal connected to the first gate turn-on wiring, the first diode including a first cathode terminal connected to the first capacitor; and
   a second diode disposed in the second wiring, the second diode including a second anode terminal connected to the first capacitor, and the second diode including a second cathode terminal connected to the gate turn-off wiring.

4. The switching circuit according to claim 1, further comprising:
   a third diode disposed in the first gate turn-off wiring or the second gate turn-off wiring, the third diode including a third anode terminal connected to the gate of the voltage-driven switching element, and the third diode including a third cathode terminal connected to the second switching element;
   a third wiring connecting a second terminal of the second capacitor and the gate of the voltage-driven switching element, the second capacitor configured to output the negative voltage; and
   a third switching element disposed in the third wiring; wherein
   the second switching element is configured to be turned on in a case of turning off the voltage-driven switching element, and
   the third switching element is configured to be turned on when the gate of the voltage-driven switching element decreases to a reference potential.

5. The switching circuit according to claim 4, further comprising
   a third gate turn-off wiring connecting the second switching element and a ground, wherein
   the charge pump unit includes:
      a fourth wiring configured to connect the third gate turn-off wiring and a third terminal of the first capacitor;
      a fifth wiring the second capacitor is disposed, the fifth wiring configured to connect to the third gate turn-off wiring between a connection point and the second switching element, the fourth wiring and the third gate turn-off wiring being connected each other at the connection point;
      a fourth diode disposed in the fourth wiring, the fourth diode including a fourth anode terminal connecting to the third terminal of the first capacitor and a fourth cathode terminal connecting to the gate turn-off wiring; and
      a fifth diode disposed in the fifth wiring, the fifth diode including a fifth anode terminal connecting to the second terminal of the second capacitor configured to output the negative voltage and a fifth cathode terminal connecting to the third terminal of the first capacitor.

6. The switching circuit according to claim 1, wherein the charge pump charging-discharging unit includes a resistor or a diode.

7. A power conversion circuit comprising:
   a voltage-driven switching element; and
   the switching circuit according to claim 1 configured to drive the voltage-driven switching element.

\* \* \* \* \*